United States Patent [19]
Fujita et al.

[11] Patent Number: 5,396,034
[45] Date of Patent: Mar. 7, 1995

[54] THIN FILM CERAMIC MULTILAYER WIRING HYBRID BOARD

[75] Inventors: Tsuyoshi Fujita; Shoichi Iwanaga; Hirayoshi Tanei, all of Yokohama, Japan

[73] Assignee: Hitachi, Tokyo, Japan

[21] Appl. No.: 27,346

[22] Filed: Mar. 8, 1993

[30] Foreign Application Priority Data

Mar. 10, 1992 [JP] Japan .................. 4-051239

[51] Int. Cl.⁶ .............................. H05K 1/00
[52] U.S. Cl. ................... 174/261; 361/795; 361/767; 174/255
[58] Field of Search ............ 361/790, 795; 174/255, 174/250, 257, 261

[56] References Cited

U.S. PATENT DOCUMENTS

| | | | |
|---|---|---|---|
| 4,084,314 | 4/1978 | Chakrabarty et al. | 29/626 |
| 4,685,033 | 8/1987 | Inoue | 361/414 |
| 4,721,831 | 1/1988 | Vora | 174/68.5 |
| 4,736,521 | 4/1988 | Dohya | 29/830 |
| 5,081,563 | 1/1992 | Feng et al. | 361/414 |
| 5,110,664 | 5/1992 | Nakanishi et al. | 428/195 |
| 5,157,589 | 10/1992 | Cole, Jr. et al. | 361/414 |

FOREIGN PATENT DOCUMENTS 60-148191 of 0000 Japan .

*Primary Examiner*—Leo P. Picard
*Assistant Examiner*—L. Thomas
*Attorney, Agent, or Firm*—Fay, Sharpe, Beall, Fagan, Minnich & McKee

[57] ABSTRACT

A ceramic thin film hybrid circuit board is provided by flattening the surface of a ceramic multi-layer interconnection substrate, forming capture pads on the flattened surface, filling spaces between the capture pads with an insulating layer composed of a glass material or an organic resin material, grinding the resultant surface until the capture pads are exposed to flatness, and laminating a plurality of thin film interconnection layers on the flattened surface. The ceramic thin film hybrid circuit board has an increased package density of mounted electronic parts such as LSIs and the like because failures of thin film interconnection layer generated owing to the roughness of the surface of the ceramic substrate, defects such as voids and the hollows produced with the capture pads are greatly reduced, and is very suitable for large scale electronic computers, in which the wiring length is reduced so as to reduce the signal delay.

20 Claims, 2 Drawing Sheets

THIN FILM CERAMIC MULTILAYER WIRING HYBRID BOARD

BACKGROUND OF THE INVENTION

1. Field of the Invention

The present invention relates to a circuit board for use in electronic equipment systems, and more particularly, to a process for manufacturing a ceramic circuit board combined with thin films specifically suitable for electronic computers having a high density packaging of electronic parts.

2. Description of the Related Art

Circuit boards for use in electronic equipment systems such as large scale electronic computers have been intensively required to be capable of interconnecting LSI devices at shorter distances to attain a high processing speed. In order to overcome this difficulty, there has been known a thick film-thin film hybrid circuit board which is produced by laminating green sheets to form a ceramic multi-layer circuit substrate and then forming thin film interconnections on the surfaces thereof by a thin film process, where finer interconnections are formed in a high density by the thin film process to achieve an increased LSI-mounting density with shorter connection distances between the LSI devices. One of the prior processes for manufacturing such ceramic thin film hybrid circuit board comprises forming thin film multi-level interconnections on the surfaces of a ceramic multi-layer substrate with insulating layers composed of primarily organic materials by a green sheet laminating process which can easily make interconnections multi-leveled, as disclosed in Japanese Patent KOKAI (Laid-open) No. 60-148191.

The ceramic multi-layer circuit board as described above has produced problems of the non-homogeneity of conductive materials and ceramics as shaping thereof is performed, the deformation of the substrate caused during firing due to the mismatch in shrinkage between the materials on the order of a warping degree of 0.1 mm/25 mm, and the limitation in accuracy of the thin film patterns produced on the warped substrate by a photolithography technique owing to the variation in depth of the focuses of the patterns projected by an exposing apparatus in the warped substrate. For this reason, the prior art employed the steps of abrading and polishing the surfaces of the ceramic multi-layer substrate to flatness and then forming thin film multi-level interconnections thereon.

Moreover, there is still another problem where the ceramic substrate shrinks when it is sintered causing a tolerance in the degree of shrinkage by each substrate so that after the ceramic substrate is sintered, the connecting pads of the thin film interconnection layer to be formed, can not capture the vias which have been formed on the sintered ceramic substrate. In order to cope with this difficulty, the prior art disposed capture pads having an area capable of covering the variation of shrinkage on the surfaces of the ceramic board.

Furthermore, an attempt has been made to make the roughness of the surfaces of the substrate have less influence on the thin film interconnection layer, which is to be formed on the surfaces of the substrate, by providing thinner capture pads as described above by vapor deposition or sputtering, or plating on the underlayer deposited by the vapor deposition or sputtering.

However, since ceramic particles having a size of several micrometers to 10 $\mu$m are used for the aforementioned ceramic multi-layer substrate, in the surface layer of the board obtained after sintering the substrate, there is generated surface roughness owing to sizes of the particles, fine voids formed by the sintering, pin holes and the like, which roughness causes formation of defects in the thin film interconnections to be formed thereon, which defects in turn inhibit formation of much finer thin film pattern. This problem remains to be solved.

SUMMARY OF THE INVENTION

It is an object of the present invention to provide a ceramic thin film hybrid circuit board having a high density wiring where the defects in thin film interconnection layers are removed by removing the roughness as described above to flatten the interface between the ceramic substrate and the thin film layer.

In order to achieve the aforementioned object, according to the present invention, spaces between the capture pads on the surfaces of the ceramic multi-layer circuit substrate are filled with an insulating layer composed of materials such as glass or organic insulating materials to flatness on the top surface.

In an aspect of the present invention, the glass layer is formed with a glass composition having a thermal expansion coefficient of 40 to $60 \times 10^{-7}/°C.$, e.g., a $B_2O_3$-$SiO_2$ system glass or a $ZnO$-$B_2O_3$-$SiO_2$ system glass.

In another aspect of the present invention, the organic insulating layer is formed with a polyimide resin material.

In still another aspect of the present invention, the ceramic multi-layer circuit board is produced by sintering a composition comprising a mixture of particulate mullite and particulate alumina-silica-magesia glass mixed in a ratio of 7:3 by weight.

In still another aspect of the present invention, the glass layer is formed by screen printing with a paste containing glass powder, heat-treating the printing layer, and grinding the surface of the layer until the surfaces of the interconnection pads are exposed to flatness.

In still another aspect of the present invention, the organic insulating layer is formed by coating with a spinner the organic materials, heat-treating the coating layer, and grinding the surface of the layer until the surfaces of the capture pads are exposed to flatness.

DETAILED DESCRIPTION OF PREFERRED EMBODIMENTS

Figure 1:
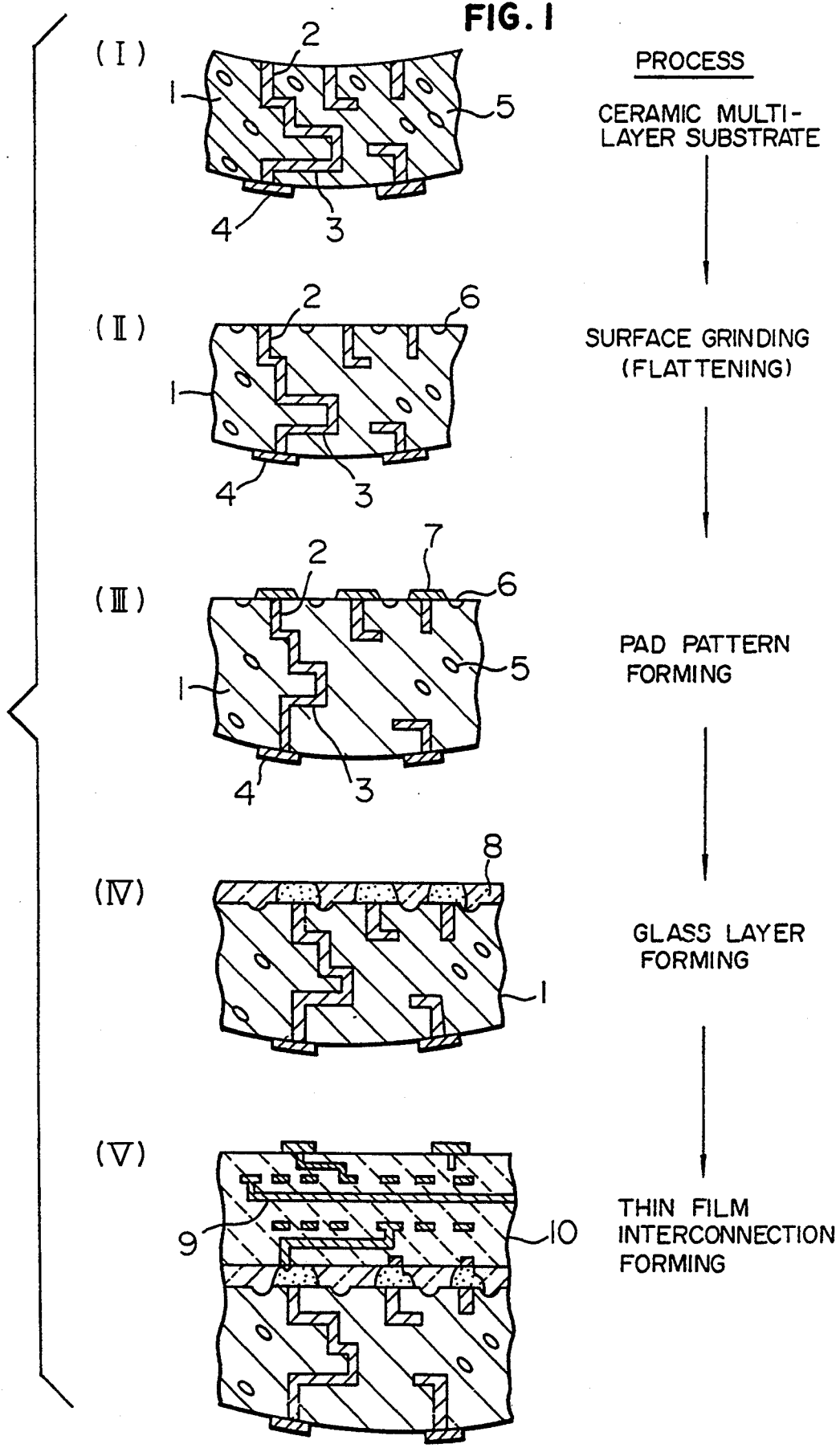
FIG. 1 is a flow sheet diagram showing steps for manufacturing the ceramic thin film hybrid circuit board with a partial schematic cross-sectional view of a structure produced in each step.

According to the present invention, spaces between the capture pads on the surfaces of the ceramic board are filled with a glass insulating layer or an organic insulating layer to flatness on the top surface, on which the thin film interconnection layer to be formed is not affected by the roughness of the surfaces of the ceramic board allowing the formation of high density thin film interconnection layer without defect.

The glass layer is formed with a glass composition having a thermal expansion coefficient of 40 to $60 \times 10^{-7}$/°C., e.g., a $B_2O_3$-$SiO_2$ system glass or a $ZnO$-$B_2O_3$-$SiO_2$ system glass, which permits the glass layer and the ceramic multi-layer circuit board to coincide with each other in the thermal expansion coefficient without causing any crack due to mismatck in the thermal expansion coefficient. On the other hand, the organic insulating layer is formed with polyimide resin, which allows firm adhesion onto the surfaces of the ceramic substrate with less thermal distortion.

In still another aspect of the present invention, the glass layer is formed by screen printing with a paste containing glass powders, heat-treating the printing layer, and grinding the surface of the layer until the surfaces of the capture pads are exposed to flatness.

The glass or organic insulating layers as described above fill the hollows formed by the thickness of the capture pads, which were formed by printing a paste containing electroconductive powder, to flatness on the top surface.

The glass layer may be produced by screen printing a paste containing glass powders commonly used in insulating and firing the printed deposits. Preferred glass particles are those having a low dielectric constant comprising 1 to 4% by weight MgO, 3.5 to 35% by weight $Al_2O_3$ and 51 to 96% by weight.

The glass layer is formed with a glass composition having a thermal expansion coefficient of 40 to $60 \times 10^{-7}$/°C., e.g., a $B_2O_3$-$SiO_2$ glass system or a $ZnO$-$B_2O_3$-$SiO_2$ glass system. Practically it should be preferably formed with the former glass system having a composition comprising 15 to 40% by weight $B_2O_3$, 30 to 60% by weight $SiO_2$, 5 to 20% by weight $Al_2O_3$, 5 to 15% by weight $CaO+BaO$, 0.1 to 3% by weight $K_2O+Na_2O$, 2 to 8% by weight $ZnO+SnO$, or the latter system glass having a composition comprising 40 to 60% by weight $ZnO$, 3 to 10% by weight $PbO$, 10 to 30% by weight $B_2O_3$, and 5 to 15% by weight $SiO_3$.

As previously described, the ceramic multi-layer circuit substrate which is produced by sintering a composition comprising a mixture of particulate mullite and particulate alumina-silica-magesia glass has a lower dielectric constant to increase the signal propagation speed.

According to the present invention, the surfaces of the ceramic substrate with the capture pads are flattened to reduce the roughness including the curvature of the surfaces of the ceramic substrate, the defects such as voids, and the hollows formed by the capture pads to such an extent as the pits having a diameter of 5 $\mu$m or more and a depth of 2 $\mu$m or more being entirely removed, whereby the density of defects present in the thin film interconnection layers can be reduced to a large extent.

The reduction in the defect density can make through-holes for interconnections contained the board finer so that the density of through-holes can be enhanced by about one order of magnitude and further that the width of the thin film wiring conductors can be made finer to be as fine as 5 $\mu$m.

By making the width of the through-holes and the thin film lines finer, connection areas required for mounting LSIs can be reduced to e.g., 1/7.

From the foregoing, it should be appreciated that the present invention can provide a ceramic thin film hybrid circuit board suitable for use in large scale computers which is capable of increasing the packaging density of electronic parts such as LSIs to be mounted and reducing a retardation in signal transmission by shortening the wiring length.

The present invention will be illustrated in detail below with reference to some Examples and accompanying drawings.

EXAMPLE 1

FIG. 1 is a flow sheet diagram showing steps for manufacturing the ceramic thin film hybrid circuit board according to the present invention.

A ceramic multi-layer board 1 was manufactured as follows:

In step I, first an alumina powder and a alumina-silica-magnesia powder are mixed in a ratio of 9:1 by weight to produce a mixture, to which polyvinyl butyral and a plasticizer were added. The mixture was shaped by a doctor blade into a green sheet having a thickness of 0.3 mm.

The green sheet was punched at predetermined sites to form through-holes having a diameter of 0.15 mm, into which a tungsten powder is filled by a printing process, and then a conductor pattern was formed with a tungsten paste by the same printing process.

Next, a plurality of the green sheets as described above having dimensions of 150 mm×150 mm, for example, forty of them were stacked, laminated together under pressure, and subjected to heat-treatment at 1600° C. in an atmosphere of a gaseous mixture of $N_2$ and $H_2$ for two hours to complete a ceramic multi-layer substrate 1.

Upper four green sheets, on the top of which a thin film was to be formed, were given only through-holes which were designed in a lattice pattern having a pitch of 0.5 mm after being sintered on the assuption that the ceramic multi-layer substrate 1 had a shrinkage of 15% during sintering. The number of the upper green sheets having only the through-hole, on the top of which the thin film was to be formed, was determined so as to leave a thickness of an unaffected internal multi-layer portion after the warpe of the sintered multi-layer ceramic substrate was removed by grinding to produce a flat top surface. In this Example, since the maximum warpe after sintering was 0.8 mm as described under, four green sheets having a thickness of 0.25 mm were provided.

In step II, the surface of the ceramic multi-layer substrate 1 was ground.

The surface of the sintered ceramic multi-layer substrate 1, on which a thin film layer was to be formed, had a warpe of 0.15 to 0.8 mm generated. The warpe and other roughness were removed by grinding with diamond powder to achieve a flatness of 20 $\mu$m or less in view of the resolution of a projection type exposure apparatus having a relatively large focal depth. By the grinding as described above, the surface layer bearing only the through-holes were ground so that a pattern containing ceramic parts and tungsten through-holes 2 was exposed on the surface of the substrate with internal multi-layer interconnections being not influenced.

As a result of the experimental production, there were produced pits having a diameter of 5 to 20 $\mu$m of about 100 per square millimeter on the surface of the ceramic substrate owing to voids generated during sintering and a discrepancy in the positions of the tungsten through-holes from those initially designed on the order of about 0.15 mm at maximum owing to a difference between the calculated shrinkage and the actually occurred shrinkage upon sintering of about 0.3%.

In step III, a pad pattern 7 was applied on the through-holes 2.

Each pad 7 was of a disk shape having a thickness of 20 μm and a diameter of 350 μm. Such pads were screen printed with a paste containing molybdenum particles in a polka-dotted pattern located on the crossings of a lattice pattern at a pitch of 0.5 mm.

Figure 2:
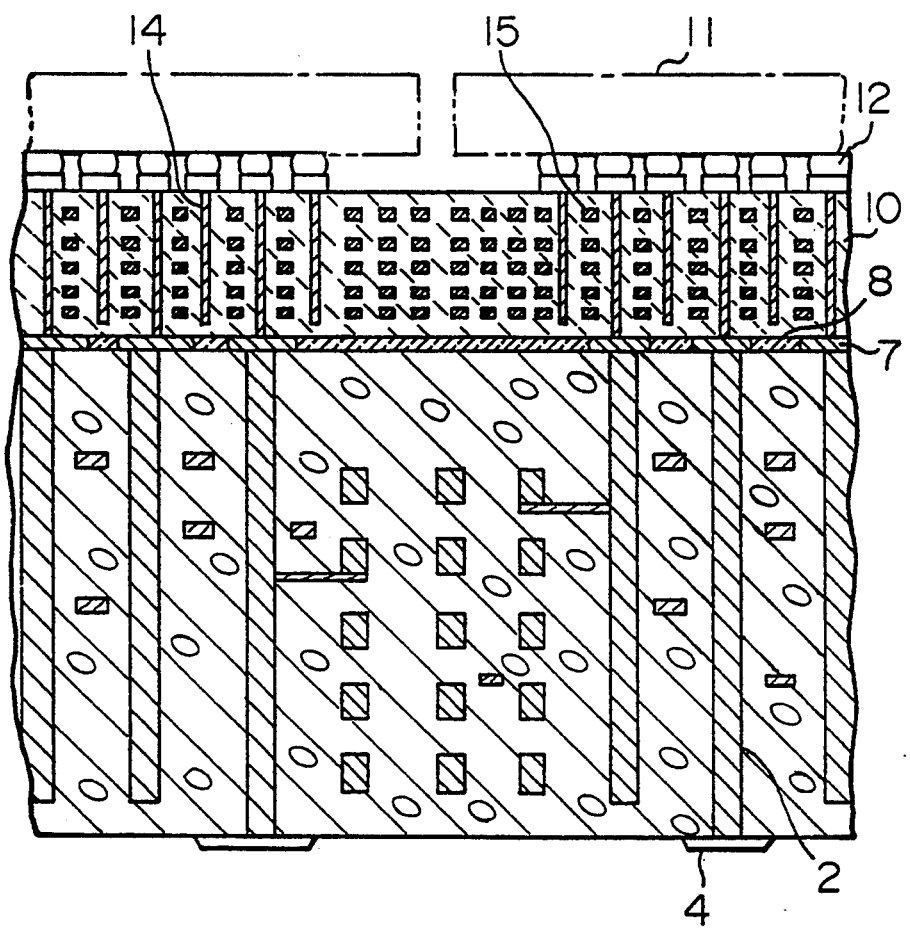
FIG. 2 is a partial schematic cross-sectional view of the ceramic thin film hybrid circuit board mounted with LSIs according to the present invention.

Each pad 7 was formd to be superimposed on each corresponding exposed through-hole 2, as shown in FIG. 2. The use of the pad 7 having a diameter of 350 μm allowed the displacement of the through-hole pattern 2 experienced upon sintering to be covered by the pad pattern.

In step IV, the substrate was heat-treated at 1500° C. for one hour in a reducing atmosphere to bake the patterned pads 7, on which a film layer of a paste containing a $B_2O_3$-$SiO_2$ glass powder having a thermal expansion coefficient of 40 to $60 \times 10^{-7}$/°C. with an ethyl cellulose binder was screen printed to a thickness of 50 μm.

Next, the substrate was heat-treated at a melting temperature of the glass of 900° to 1100° C. for 1 to 6 hours to remove bubbles in the glass layer and at the same time to flow the glass into the pits 6 attributed to voids 5 on the ground surface to form a glass layer 8. This heat-treatment shrinked the glass layer 8 to a thickness of about 25 μm.

Then, the surface of the glass layer 8 was ground to flatness until the pad pattern 7 is exposed, and thereafter, I/O pin pads 4 on the bottom surface of the ceramic multi-layer substrate were plated to complete the ceramic multi-layer substrate 1.

The roughness and defects on the surface of the completed ceramic multi-layer substrate 1 was reduced to a density of pits having a diameter of 5 μm or more of 0.01 per square centimeter showing surface conditions suitable for the formation of fine thin film pattern.

In step V, thin film multi-level interconnections were formed.

First, an organic film was formed on the surface of the substrate by coating with a spinner a varnish containing polyimide organic material to a thickness of 10 μm after curing and then heat-treating.

On the surface of the organic film, there were otherwise ordinarily generated numerous big and small defects attributable to the roughness of the surface of the substrate, though in the present invention the flattening of the surface effected in the step II and IV allowed removal of all the pits having a diameter of 5 μm or more and a depth of 2 μm or more.

After the curing of the organic film, through-holes 14 having a diameter of 30 μm were formed by photoetching.

Substrates produced by the prior techniques where the step grinding the surface of the substrate was not incorporated suffered from the warping of the substrate and the defects on the surface leading to insufficient resolution in the pattern formation by a photolithography technique with a tolerance in the diameter of through-holes on the order of ±20 μm and a practical limit in fining the through-holes 14 of a diameter of 50 μm. In contrast, in the process for manufacturing the ceramic thin film hybrid board according to the present invention, the warping and the defects were removed so that sufficient resolution could be achieved by the photolithography technique and the through-holes could be formed at an accuracy of ±2 μm. As a result, the through-holes 14 could be practically fined to an extent of a diameter of 5 μm. That is, the density could be improved by about one order of magnitude.

Next, on the aforementioned organic film, there were sequentially formed films of Cr, Al and Cr of a thickness of 0.1 μm, 5 μm and 0.1 μm, respectively, by sputtering and then etched to form an interconnection pattern of thin film conductor 9.

The thin film conductor 9 could be fined to an extent of a width of 5 μm.

In addition, a thin film interconnection layer 10 having the thin film conductor 9 and through-holes 14 formed therein could be observed to have none of failures such as break down and short-circuits attributable to the warping and the roughness of the surface of the ceramic multi-layer substrate 1.

EXAMPLE 2

A logical LSI mounting circuit board having various dimensions designed as shown in Table 1 was manufactured according to the identical procedure to that in Example 1.

TABLE 1

| Designed items | Designed dimensions |
| --- | --- |
| Substrate size | 160 mm × 160 mm |
| Diameter of ceramic through-holes | 120 μm |
| Ceramic line width | 100 μm |
| Ceramic lattice pitch | 500 μm |
| Number of ceramic conductive layers | 30 |
| Thin film through-hole diameter | 30 μm |
| Thin film line width | 30 μm |
| Thin film lattice pitch | 125 μm |
| Number of thin film conductive layers | 10 |

The 100 μm of the ceramic line width shown in Table 1 is a minimum width achievable by the existing thick film-printing techniques.

The 120 μm of the ceramic through-holes were selected because the minimum of the diameter of the punch used for punching the holes was 100 to 150 μm for imparting a practical strength.

That is, in this Example, the maximum wiring density in the ceramic multi-layer substrate achievable by the existing techniques was realized.

At a ceramic lattice pitch of 500 μm, fundamentally one signal conductor 3 in the ceramic multi-layer substrate was disposed in each spacing between the lattices. Therefore, the through-holes 2 were disposed at a pitch of 500 μm on the side of the substrate, on which the thin film was to be formed.

Similarly, one thin film conductor 9 was formed each between the through-holes 14, and the lattice pitch was 125 μm with the through-hole diameter and the line width being 30 μm, respectively.

Although the above thin film line could have been made further finer, the above vaule was selected in view of the resistance of the line. The number of the thin film interconnection layers was 10 taking account of the yield.

On the ceramic thin film hybrid circuit board in this Example, there were loaded 300 signal terminals for signal, 600 terminals for power supply, LSIs having 20k gates of dimensions of 10×10 mm² by face down solder bonding with solder balls 12, as shown in FIG. 2.

LSIs 11 had each terminal thereof connected to one of the through-holes 14 passing through the thin film interconnection layer 10 and were connected to the terminals of other LSIs via several interconnection layers 15 in the ceramic multi-layer circuit board.

The connections between LSIs were effected using the signal lines formed between the thin film lattices as well as the through-holes connecting between the thin film layers, and terminals having incomplete connection in the thin film interconnection layer 10 were assigned thereto a through-hole 2 so that they could be interconnected in the ceramic substrate. That is, the terminals incapable of connecting LSIs to one another via the thin film interconnection layer 10 alone were connected to LSIs via the signal line and through-holes in the thin film interconnection layer and via the interconnections in the ceramic substrate, whereby the connection between the LSI chips could be accomplished.

Generally the number of the through-holes in the thin film layers required for such interconnections are on the order of twice the number of the terminals of the LSIs.

The electronic equipment systems mounted with logical LSIs have been vigorously required to have an enhanced LSI package density, since the magnitude of the delay of signal transmission through the interconnections between the LSIs is one of factors determining the performance of the systems. Therefore, it has been one of important problems to reduce the delay of signal.

Since the thin film interconnection layer according to the present invention has sufficiently high density of through-holes, the provision of the number of through-holes required for connecting all the pads of a LSI within the surface area thereof can be ensured so that a number of LSIs can be disposed at a minimum distance without spacing therebetween.

With the prior art ceramic thin film hybrid circuit board, there was required a surface area of 27 mm×27 mm in order to ensure the number of through-holes required for connecting the LSI as above. The LSIs have dimensions of 10×10 $mm^2$. Therefore, according to the present invention the mounting pitch could be reduced to 1/2.7.

As a result of application of the ceramic thin film hybrid circuit board as described above according to the present invention to an electronic computer, the processing speed could be enhanced by 30%. This is attributable to the shortening of the wiring length as described above.

EXAMPLE 3

Figure 3:
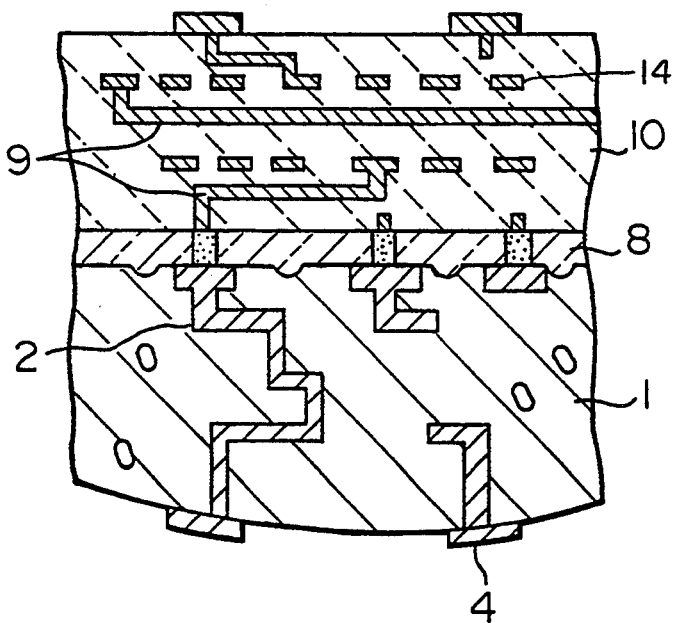
FIG. 3 is a partial schematic cross-sectional view of the ceramic thin film hybrid circuit board according to the present invention.

Under the conditions that the diameter of through-holes in the pattern thereof in upper four green sheets of the ceramic multi-layer substrate 1, on the top of which a thin film was to be formed, was 350 $\mu$m and the diameter of pads in the pattern thereof formed after grinding was 150 $\mu$m, the circuit board as shown in FIG. 3 was manufactured by following the procedure in Example 1 and the identical reduction in defect density was achieved.

EXAMPLE 4

A mixture of a mullite powder and an alumina-silica-magnesia glass powder in a ratio of 7:3 was used as materials for the ceramic substrate. The identical through-holes and patterns to those in Example 1 or Example 3 were formed. The treatment of the surface, on which a thin film was to be formed, and the formation of the thin film layer were accomplished. The similar results to those in the Examples were obtained.

In addition, the dielectric constant of the ceramic was reduced to 6 or less as opposed to about 9 in Example 1 so that the signal propagation speed through the interconnections in the ceramic substrate was enhanced by 30%.

EXAMPLE 5

The pas pattern 7 as in Examples 1 and 3 was formed with a paste of a mixture of a copper powder and a glass powder and heat-treated at 900° C. for one hour in an atmosphere of $N_2$ to be baked onto the substrate. The glass layer 8 was formed by using a $ZnO$-$B_2O_3$-$SiO_2$ crystallizable glass powder and heat-treating at 750° C. The identical results were obtained.

EXAMPLE 6

The pad pattern 7 as in Examples 1 and 3 was produced by sputtering chromium and copper to form a Cr film having a thickness of 0.5 $\mu$m and a Cu film having a thickness of 7 $\mu$m and by photo-etching after the overall film formation. On the surfaces, there was formed the glass layer 8 by heat-treating the $ZnO$-$B_2O_3$-$SiO_2$ crystallizable glass powder at 750° C. The identical results were obtained.

EXAMPLE 7

The process for manufacturing the circuit board as in Examples 3 to 6 was applied to the electronic apparatus as in Example 2. The same effects of reducing the signal delay as those in Example 2 were achieved.

What is claimed is:

1. A thin film multilayer wiring/ceramic multilayer wiring hybrid board comprising a ceramic multi-layer wiring substrate having a flattened surface, on which wiring pads are formed, and a plurality of thin film wiring layers laminated on said substrate, where spaces between said wiring pads on the surface of said multi-layer wiring substrate are filled with an insulating layer in such a manner that the top surface of said wiring pads and the surface of said insulating layer form a common flattened surface.

2. The thin film multilayer wiring hybrid board according to claim 1, wherein said insulating layer comprises a glass layer.

3. The thin film multilayer wiring hybrid board according to claim 1, wherein said insulating layer comprises an organic material layer.

4. The thin film multilayer wiring hybrid board according to claim 2, wherein said glass layer is formed with a $B_2O_3$-$SiO_2$ glass having a thermal expansion coefficient of 40 to 60×$10^{-7}$/°C.

5. The thin film multilayer wiring hybrid board according to claim 2, wherein said glass layer is formed with a $ZnO$-$B_2O_3$-$SiO_2$ glass.

6. The thin film multilayer wiring hybrid board according to claim 2, wherein said glass layer is formed with a polyamide resin.

7. The thin film multilayer wiring hybrid board according to claim 1, wherein said interconnection pads are formed by printing a paste containing an electroconductive powder.

8. The thin film multilayer wiring hybrid board according to claim 1, wherein said ceramic multi-layer interconnection substrate is formed by sintering a mixture of mullite particles and alumina-silica-magnesia glass particles in a ratio of 7:3 by weight.

9. The thin film multilayer wiring hybrid board according to claim 2, wherein said interconnection pads are formed by printing a paste containing an electroconductive powder.

10. The thin film multilayer wiring hybrid board according to claim 3, wherein said interconnection pads are formed by printing a paste containing an electroconductive powder.

11. The thin film multilayer wiring hybrid board according to claim 4, wherein said interconnection pads are formed by printing a paste containing an electroconductive powder.

12. The thin film multilayer wiring hybrid board according to claim 5, wherein said interconnection pads are formed by printing a paste containing an electroconductive powder.

13. The thin film multilayer wiring hybrid board according to claim 6, wherein said interconnection pads are formed by printing a paste containing an electroconductive powder.

14. The thin film multilayer wiring hybrid board according to claim 2, wherein said ceramic multi-layer interconnection substrate is formed by sintering a mixture of mullite particles and alumina-silica-magnesia glass particles in a ratio of 7:3 by weight.

15. The thin film multilayer wiring hybrid board according to claim 3, wherein said ceramic multi-layer interconnection substrate is formed by sintering a mixture of mullite particles and alumina-silica-magnesia glass particles in a ratio of 7:3 by weight.

16. The thin film multilayer wiring hybrid board according to claim 4, wherein said ceramic multi-layer interconnection substrate is formed by sintering a mixture of mullite particles and alumina-silica-magnesia glass particles in a ratio of 7:3 by weight.

17. The thin film multilayer wiring hybrid board according to claim 5, wherein said ceramic multi-layer interconnection substrate is formed by sintering a mixture of mullite particles and alumina-silica-magnesia glass particles in a ratio of 7:3 by weight.

18. The thin film multilayer wiring hybrid board according to claim 6, wherein said ceramic multi-layer interconnection substrate is formed by sintering a mixture of mullite particles and alumina-silica-magnesia glass particles in a ratio of 7:3 by weight.

19. The thin film multilayer wiring hybrid board according to claim 7, wherein said ceramic multi-layer interconnection substrate is formed by sintering a mixture of mullite particles and alumina-silica-magnesia glass particles in a ratio of 7:3 by weight.

20. A ceramic thin film hybrid circuit board which comprises:
(a) a ceramic multi-layer interconnection substrate having a flattened surface and interconnection pads formed on said flattened surface;
(b) an insulating layer formed on said flattened surface of said interconnection substrate so that the surfaces of said interconnection pads and the surface of said insulating layer form a common flattened surface; and
(c) a plurality of thin film interconnection layers laminated on said common flattened surface.

* * * * *